US006645803B1

(12) United States Patent
Kalnitsky et al.

(10) Patent No.: US 6,645,803 B1
(45) Date of Patent: Nov. 11, 2003

(54) METHOD FOR MODIFYING THE DOPING LEVEL OF A SILICON LAYER

(75) Inventors: Alexander Kalnitsky, Grenoble (FR); Arnaud Lepert, Crolles (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 08/713,083

(22) Filed: Sep. 12, 1996

(30) Foreign Application Priority Data

Sep. 28, 1995 (FR) .......................................... 95 11626

(51) Int. Cl.$^7$ ........................................ H01L 21/8234
(52) U.S. Cl. ........................ 438/238; 438/385; 438/655
(58) Field of Search .............................. 438/151, 171, 438/190, 238, 210, 329, 382, 330, 384, 385, 607, 655, 656, 657, 660, 661, 662, 663, 664, 281, 333, 215, 467, 469, 470, 132, 683; 257/529

(56) References Cited

U.S. PATENT DOCUMENTS

| 4,135,295 A | * | 1/1979 | Price ........................... 257/528 |
| 4,198,744 A | * | 4/1980 | Nicolay ....................... 257/528 |
| 4,555,842 A | | 12/1985 | Levinstein et al. ............ 29/571 |
| 4,584,760 A | | 4/1986 | Okazawa ..................... 29/571 |
| 4,606,781 A | | 8/1986 | Vyne ........................... 148/183 |
| 4,683,442 A | | 7/1987 | Vyne ........................... 330/261 |
| 4,786,611 A | | 11/1988 | Pfiester ........................ 437/45 |
| 4,830,976 A | * | 5/1989 | Morris et al. ................ 438/281 |
| 4,870,472 A | | 9/1989 | Vyne ............................ 357/51 |
| 5,416,034 A | * | 5/1995 | Bryant ........................ 438/238 |
| 5,670,424 A | * | 9/1997 | Chan et al. .................. 438/215 |
| 5,708,291 A | * | 1/1998 | Bohr et al. .................. 257/529 |

FOREIGN PATENT DOCUMENTS

EP         A-0 164 186      12/1985       H01L/21/28

OTHER PUBLICATIONS

Journal of Vacuum Science & Technology A (Vacuum, Sufacrs, and Films), Mar.–Apr. 1985, USA, vol. 3, No. 2, pp 324–330, Masters R.G., "Chemical Changes In Chromium Silicide Thin Films As A Result Of Laser Trimming As Determined By SAM and XPS".
Patent Abstracts of Japan, vol. 013, No. 525 (E–850), Nov. 22, 1989 & JP–A–01 214170 (Mitsubishi Electric Corp.).
Patent Abstracts of Japan, vol. 012, No. 062 (E–686), Nov. 25, 1988 & JP–63 177560 (Oki Electric Ind. Co. Ltd.).
Patent Abstracts of Japan, vol. 007, No. 062 (E–164), Mar. 15, 1983 & JP–A–57 208172 (Nippon Denki KK).

* cited by examiner

*Primary Examiner*—Savitri Mulpuri
(74) *Attorney, Agent, or Firm*—Wolf, Greenfield & Sacks, P.C.; James H. Morris

(57) ABSTRACT

A method for modifying the doping level of a doped silicon layer including the steps of coating the silicon layer with a silicide layer made of a refractory metal, and heating the interface region between the silicon and the silicide to a predetermined temperature. The method may be applied to the fabrication of an adjustable resistor or a MOS transistor having an adjustable threshold.

30 Claims, 3 Drawing Sheets

METHOD FOR MODIFYING THE DOPING LEVEL OF A SILICON LAYER

BACKGROUND OF THE INVENTION

1. Field of the Invention

The present invention relates to a method for modifying the doping level of a region or layer of silicon and its application to the fabrication of adjustable resistors or MOS transistors having an adjustable threshold voltage.

2. Discussion of the Related Art

In many integrated circuits, it is desireable to fabricate adjustable resistors in order to obtain resistors having relatively accurate and predetermined resistances, or to obtain a high or low resistance so that the resistor substantially operates as a fuse. Similarly, for numerous integrated circuits, it is desired to fabricate various MOS transistors having different threshold voltages. Many methods are known to obtain such adjustable resistors and such transistors with an adjustable threshold; however, these methods present various advantages and drawbacks.

Also, it is known that when a silicide contact is made on a semiconductor, the contact resistance increases when the structure is subjected to a thermal process. Such a structure is represented in FIG. 1 in which region 1 of a first conductivity type is formed in a substrate 2 of, for example, the opposite conductivity type. The upper surface of the substrate is insulated by an isolating layer 3, usually made of silicon oxide, and a silicide 4 is formed in the aperture. Heating the silicide causes depletion of the doping atoms in the region adjacent to the silicide-silicon interface. This phenomenon is known and is generally considered as a drawback which it is desireable to remedy in various ways by providing, for example, an overdoped region, or more simply by avoiding thermal steps after formation of the silicide.

The present invention takes advantage of this phenomenon in order to create adjustable resistors and MOS transistors with adjustable threshold voltage.

SUMMARY OF THE INVENTION

An object of the present invention is to provide a method for fabricating an adjustable resistor, which is simple to implement and is compatible with conventional integrated circuit techniques.

A further object of the present invention is directed to a method for fabricating a MOS transistor with an adjustable threshold, which is simple to implement and is compatible with conventional integrated circuit techniques.

To achieve these objects, the present invention provides a method for modifying the doping level of a doped silicon region or layer, including the steps of coating the silicon region or layer with a silicide layer made of a refractory metal; and heating the interface region between the silicon and the silicide to a predetermined temperature.

According to an embodiment of the invention, the silicon is a single-crystal silicon.

According to an embodiment of the invention, the silicon is a polycrystalline silicon.

According to an embodiment of the present invention, the silicide is a titanium silicide.

According to an embodiment of the present invention, the heating temperature ranges from 750° C. to 1050° C.

According to an embodiment of the present invention, heating is achieved by current flow.

According to an embodiment of the present invention, heating is achieved by optical irradiation, such as laser irradiation.

According to an embodiment of the present invention, the thickness of the silicon region or layer ranges from 100 to 400 nm.

According to an embodiment of the present invention, the silicon region or layer has a doping level of approximately $5 \times 10^{20}$ atoms/cm$^3$ and a resistance per square ranging from 1 to 3 Ω per square.

According to an embodiment of the present invention, the thickness of the silicide layer ranges from 10 nm to 100 nm.

In an application of the method for the fabrication of an adjustable resistor, the method includes the steps of providing a silicon region or layer; coating the ends of the region or layer with a silicide; and heating the interface regions between the silicon and the silicide.

In an application of the method for the fabrication of a MOS transistor having an adjustable threshold voltage, the method includes the steps of forming a MOS transistor having a gate region that includes a superposition of a gate isolating layer, a polycrystalline silicon and a titanium silicide region; and heating the interface regions between the silicon and the silicide.

The foregoing and other objects, features, aspects and advantages of the invention will become apparent from the following detailed description of the present invention when taken in conjunction with the accompanying drawings.

As usual in the field of semiconductors, the various top views and cross-sectional views are not drawn to scale to simplify their interpretation.

DETAILED DESCRIPTION

Figure 1:
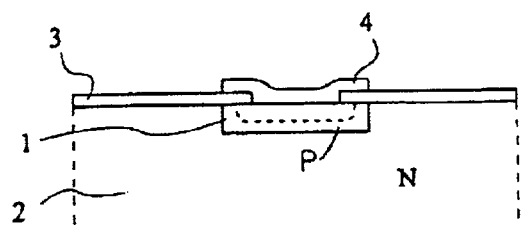
FIG. 1 represents a conventional contact structure.
Figure 2A:
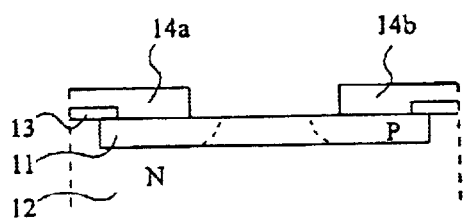
FIGS. 2A and 2B are a schematic cross-sectional view and a schematic top view, respectively, of a first embodiment of an adjustable resistor according to the present invention.

FIG. 2A represents a silicon region 11 of a first conductivity type formed in a substrate 12 of a second conductivity type. The periphery of region 11 is superficially insulated by an isolating layer 13, for example made of silicon oxide. A titanium silicide (TiSi$_2$) layer 14 is formed and etched in order to have substantially the configuration represented in FIG. 2B, i.e., so that two portions 14a and 14b partially coat two opposite portions of region 11. Thus, if contacts, for example made of aluminum, are formed over the silicide portions 14a and 14b, the resistance of silicide, of the silicide-silicon interface and of the silicon successively appear between these contacts.

When the silicide-silicon interface regions are heated, the resistance between regions 14a and 14b increases. The resistance increase is mainly due to migration, or outdiffusion, of the dopants contained in region 11 toward the silicide regions 14a and 14b. The migration causes the resistance of the corresponding silicon regions to increase due to a decrease in their doping level. The migration also causes the interface resistance to increase, possibly further to an increase of the resistance of the titanium silicide layer further to the introduction of doping atoms therein.

Figure 4:
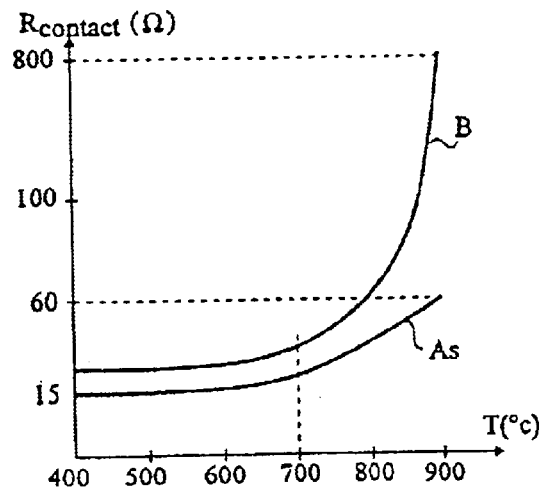
FIG. 4 represents the variation of the contact resistance as a function of temperature for silicon layers doped with boron and arsenic, respectively, contacting a titanium silicide layer.

FIG. 4 illustrates the contact resistance in ohms as a function of the temperature for regions 11 doped with arsenic (As) and boron (B), respectively. As shown in FIG. 4, the resistance remains substantially constant as long as the interface temperature remains below 700° C. then, when the temperature increases beyond 700° C. (until approximately 1050° C.), the resistance rapidly varies. It is noteworthy that, in the case of arsenic, for example, the resistance increases from 15Ω to 60Ω between 700° C. and 900° C. whereas, in the case of boron, the resistance increases from 25Ω to 800Ω.

Figure 5:
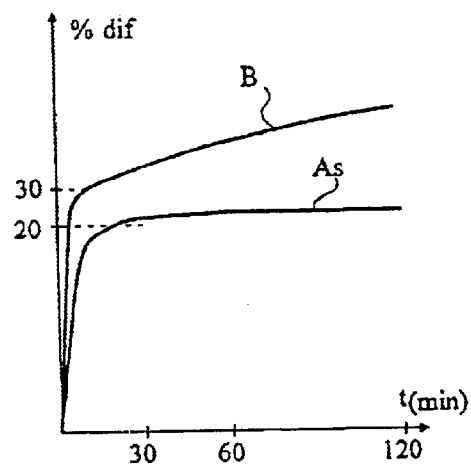
FIG. 5 represents an outdiffusion ratio as a function of time for silicon layers doped with arsenic or boron, respectively, at a predetermined temperature.

FIG. 5 represents the diffusion ratio as a function of time in minutes. It is also noteworthy that the diffusion is achieved in a very short time. Then, a saturation phenomenon occurs as soon as a duration of approximately one minute for boron and approximately ten minutes for arsenic is exceeded.

According to the invention, two means are provided to heat the silicide/silicon interface. The first means consists of causing a current to flow between the silicide portions 14a and 14b. The first means permits a relatively accurate adjustment of heating and is preferred to adjust the resistance value and can also be used to significantly increase the resistance value in order to obtain a resistor acting as a fuse. The second means consists of irradiating the related regions with a beam causing an heating of the interface. This can, for example, be achieved by a laser beam within a range of wavelengths corresponding to a high absorption area of the materials that are to be irradiated.

Figure 2B:
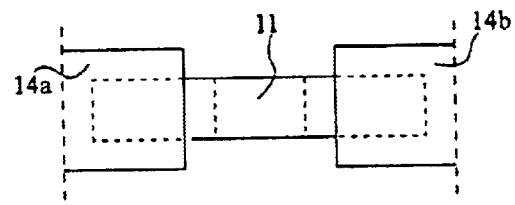

FIGS. 2A and 2B represent a first embodiment of the present invention which is used to form an adjustable resistor with a doped silicon region formed in a silicon substrate of an opposite doping type. It should be noted that the phenomenon according to the invention also applies to a polycrystalline silicon layer.

Figure 3A:
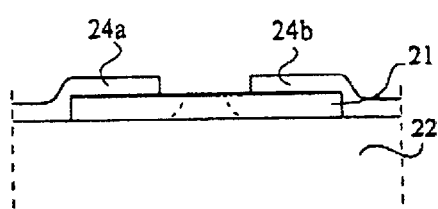
FIGS. 3A and 3B are a schematic cross-sectional view and a schematic top view, respectively, of a second embodiment of an adjustable resistor according to the present invention.
Figure 3B:
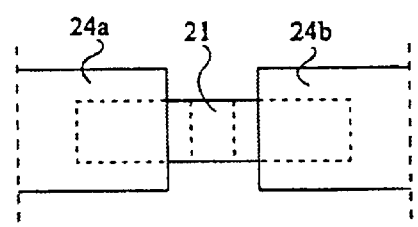

FIG. 3A represents a silicon strip 21, such as polycrystalline silicon, over an insulating substrate 22, for example an oxide layer in turn formed on a silicon wafer. As above, the opposite ends of the polycrystalline silicon strip 21 are coated with titanium silicide regions, 24a and 24b, respectively. For this resistor, the same phenomena as those described above occur.

As is apparent to those skilled in the art, various modifications can be made to the above disclosed preferred embodiments. For example, it is also possible to use dopants other than arsenic or boron to dope the silicon, although they are presently preferred. Furthermore, instead of titanium silicide, it is possible to use other refractory metal suicides, for example a silicide selected from the group including tungsten silicide, cobalt silicide and nickel silicide. Similarly, the geometrical configuration of the region or layer of silicon and the configuration of the silicide areas which coat the latter may be selected by those skilled in the art. For example, structures with median silicide areas may be selected to form adjustable dividing bridges.

Another embodiment of the present invention is directed to field effect transistors having an adjustable threshold.

Figure 6A:
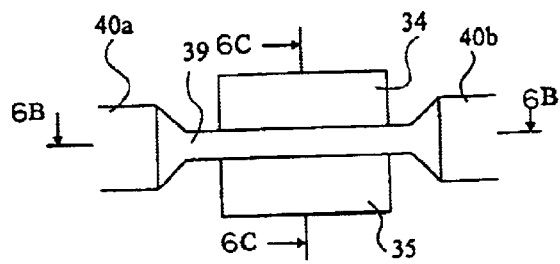
FIGS. 6A to 6C are a top view and cross-sectional views, respectively, along lines B—B and C—C of FIG. 6A of a MOS transistor having an adjustable threshold according to the invention.
Figure 6B:
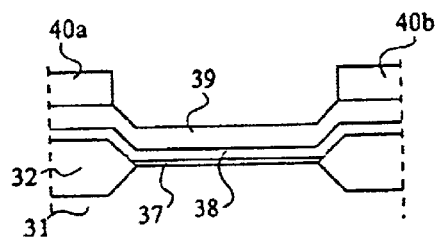
Figure 6C:
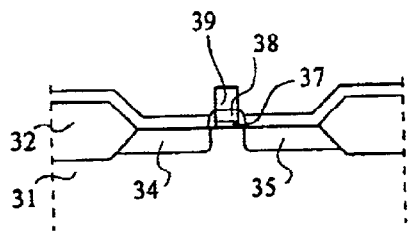

FIGS. 6A, 6B and 6C are a top view, a cross-sectional view, respectively, along line B—B and a cross sectional view along line C—C, of a MOS transistor according to the invention.

The MOS transistor is formed on a substrate 31 inside an area defined by a thick oxide 32. The MOS transistor includes source and drain regions 34 and 35 separated by a gate region including a sandwich formed by a gate oxide layer 37, a doped polycrystalline silicon layer 38, and a silicide layer 39. Contacts, for example made of aluminum, 40a and 40b, are formed at both ends of the titanium silicide strip 39.

The invention takes advantage of the fact that the threshold of a MOS transistor depends not only on the doping level of the channel region or thickness of the gate isolating layer but also, in particular, on the resistance of the gate layer (because the presence of a more resistive layer on the gate isolating layer can be considered as an increase in the thickness of the gate isolating layer).

Thus, the threshold of a transistor such as the transistor of FIGS. 6A–6C varies when the resistance of the polycrystalline silicon layer 38 on the gate varies. To vary the resistance, the titanium silicide layer which coats the gate layer is heated. This is preferably carried out by transmitting a high current between contacts 40a and 40b, the current being modulated as a function of the desired result. Of course, the heating of the gate region is preferably achieved without heating the drain and source regions because, conventionally, the source and drain regions are also coated with a silicide layer and it is desireable to prevent the contact resistance from increasing at the silicon-silicide interface of the source and drain regions.

Figure 7:
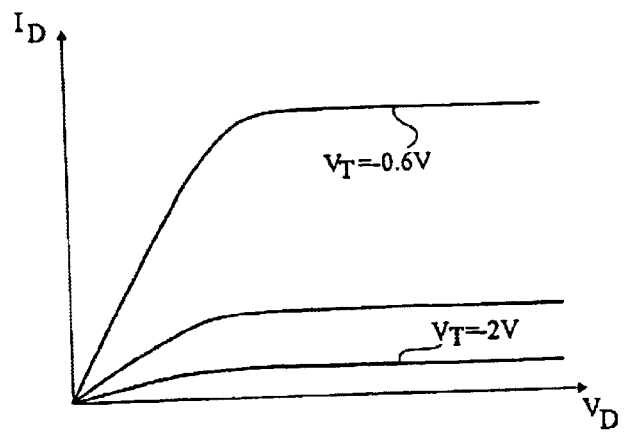
FIG. 7 is a diagram illustrating the drain current-voltage characteristic of a MOS transistor according to the invention at various temperatures.

As shown in FIG. 7, for a transistor normally having a −0.6 volt VT, threshold voltages as low as −2 volts have been obtained. The intermediate waveform corresponds to the flow of a lower current.

Of course, various modifications corresponding to the various alternatives used to fabricate MOS transistors may be made to the present invention. In the given example, spacers are represented on both sides of the superposition of the gate isolating layer and polycrystalline silicon layer. The spacers may be omitted in the case of other fabrication techniques. Also, spacers may be conventionally used to create LDD-type structures.

According to a further alternative of the present invention, the polycrystalline silicide layer can be interrupted at the gate to increase heating when current flows. In this case, the interruption must be small enough so that migration of the polycrystalline silicon dopant toward the titanium silicide or other silicide can occur.

Similarly, various alternatives described above with relation to the fabrication of a resistor also apply to the fabrication of a MOS transistor having an adjustable threshold.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A method for fabricating an adjustable resistor by modifying a doping level of a selected silicon region among a plurality of silicon regions, each silicon region having a first doping level, comprising the steps of:

coating said plurality of silicon regions with a refractory metal silicide layer that includes a first portion and a second portion, such that an uncovered portion of the selected silicon region exists between the first and second portions of the refractory metal silicide layer;

heating at least one of the first and second portions of the silicide layer to a selected temperature; and changing a doping level of the selected silicon region from the first doping level to a second doping level different than the first doping level by applying said heating step for a selected time so as to cause migration or outdiffusion of dopants contained in the plurality of silicon regions toward the silicide layer, thereby varying a resistance of the adjustable resistor between the first and second portions of the silicide layer.

2. The method of claim 1, wherein when the silicide layer is heated a resistance of the selected silicon region varies.

3. The method of claim 1, wherein the migration causes a resistance of the plurality of silicon regions to increase due to a decrease in the doping level of the plurality of silicon regions.

4. The method of claim 3, wherein the migration also causes an interface resistance between the selected silicon region and the silicide layer to increase, causing an increase to a resistance of the silicide layer further to an introduction of doping atoms therein.

5. The method of claim 1, wherein the selected silicon region is a single-crystal silicon.

6. The method of claim 1, wherein the selected silicon region is a polycrystalline silicon.

7. The method of claim 1, wherein the silicide layer is a titanium silicide.

8. The method of claim 1, wherein the selected temperature is in a range from 750° C. to 1050° C.

9. The method of claim 1, wherein the heating is achieved by providing a current flow through the interface region.

10. The method of claim 1, wherein the heating is achieved by optically irradiating the interface region.

11. The method of claim 10, wherein the step of optically irradiating the interface region is achieved with laser irradiation.

12. The method of claim 1, wherein a thickness of the selected silicon region is in a range from 100 nm to 400 nm.

13. The method of claim 1, wherein the doping level of the selected silicon region is approximately $5 \times 10^{20}$ atoms/cm$^3$ and the selected silicon region has a resistance in a range of $1\Omega$ to $3\Omega$ per square area of the selected silicon region.

14. The method of claim 1, wherein a thickness of the silicide layer is in a range from 10 nm to 100 nm.

15. A method for fabricating an adjustable resistor by modifying a doping level of a selected silicon region among a plurality of silicon regions, each silicon region having a first doping level, including the steps of:

coating said plurality of silicon regions with a refractory metal silicide layer that includes a first portion and a second portion, such that an uncovered portion of the plurality of silicon regions exists between the first portion and the second portion of the silicide layer;

heating an interface region between the selected silicon region and the silicide layer to a selected temperature; and causing, by said heating step, a doping level of the selected silicon region to decrease from the first doping level to a second doping level different than the first doping level due to migration, or outdiffusion, of dopants contained in the plurality of silicon regions toward the silicide layer; thereby causing a resistance between the first portion and the second portion of the silicide layer to increase so as to determine a resistance of the adjustable resistor.

16. The method of claim 15, wherein the selected silicon region is a single-crystal silicon.

17. The method of claim 15, wherein the selected silicon region is a polycrystalline silicon.

18. The method of claim 15, wherein the silicide layer is a titanium silicide.

19. The method of claim 15, wherein the selected temperature is in a range from 750° C. to 1050° C.

20. The method of claim 15, wherein the step of heating is achieved by providing a current flow through the interface region.

21. The method of claim 15, wherein the step of heating is achieved by optically irradiating the interface region.

22. The method of claim 21, wherein the step of optically irradiating the interface region is achieved with laser irradiation.

23. The method of claim 15, wherein a thickness of the selected silicon region is in a range from 100 nm to 400 nm.

24. The method of claim 15, wherein the doping level of the selected silicon region is approximately $5 \times 10^{20}$ atoms/cm$^3$ and the selected silicon region has a resistance in a range of $1\Omega$ to $3\Omega$ per square area of the selected silicon region.

25. The method of claim 15, wherein a thickness of the silicide layer is in a range from 10 nm to 100 nm.

26. The method of claim 15, wherein the migration causes a resistance of the plurality of silicon regions to increase due to a decrease in the doping level of the plurality of silicon regions.

27. The method of claim 26, wherein the migration also causes an interface resistance between the selected silicon region and the silicide layer to increase, causing an increase to a resistance of the silicide layer further to an introduction of doping atoms therein.

28. A method for fabricating an adjustable resistor, including the steps of:

providing a doped silicon region having a first end and a second end;

coating each end of the silicon region with a silicide;

heating an interface region between the silicon region and the silicide to cause a migration of dopants in the doped silicon region toward the first and second ends of the doped silicon region, said migration decreasing a doping level of the doped silicon region; and performing said heating step for a selected time to change the doping level of the silicon region from a first doping level to a second doping level different than the first doping level, to vary a resistance of the adjustable resistor.

29. A method for fabricating an adjustable resistor including modifying a doping level of a doped silicon region comprising the steps of:

providing the doped silicon region of a first conductivity type in a semiconductor material layer of a second conductivity type:

forming a first silicide layer disposed above a first end of the doped silicon region;

forming a second silicide layer disposed above a second end of the doped silicon region;

the first and second silicide layers overlaying the first end and the second end of the doped silicon region so that an uncovered portion of the doped silicon region exists therebetween;

applying heat to at least one of the first silicide layer and the second silicide layer to vary the doping level of the doped silicon region, and controlling said heating step to achieve a modified doping level different than an initial doping level of the doped silicon region so as to determine a resistance of the adjustable resistor.

30. The method of claim 29, wherein the modified doping level is approximately $5 \times 10^{20}$ atoms per cm$^3$.

* * * * *